United States Patent [19]

Chapman et al.

[11] Patent Number: 5,287,340
[45] Date of Patent: Feb. 15, 1994

[54] DIFFERENTIAL AMPLIFIER FOR OPTICAL DETECTORS IN AN OPTICAL DATA STORAGE SYSTEM

[75] Inventors: Dale B. Chapman; Michael O. Jenkins, both of San Jose; Stephen A. Jove, Watsonville; Jacobus C. L. van Peppen, San Jose, all of Calif.

[73] Assignee: International Business Machines Corporation, Armonk, N.Y.

[21] Appl. No.: 835,153

[22] Filed: Feb. 13, 1992

[51] Int. Cl.⁵ .............................. G11B 7/00; H03F 3/08
[52] U.S. Cl. ............................ 369/44.41; 369/44.32; 369/44.36; 330/308
[58] Field of Search ............... 369/44.35, 44.36, 44.32, 369/44.41, 44.42; 250/214 A, 214 AG, 214 R; 330/59, 308, 85, 259

[56] References Cited

U.S. PATENT DOCUMENTS 4,853,530  8/1989  Muto ............................. 250/214 A
5,004,901  4/1991  Yoshimoto et al. ............ 250/214 A

FOREIGN PATENT DOCUMENTS 63-249382 10/1988 Japan.

OTHER PUBLICATIONS

G. T. Sincerbox, "Miniature Optics for Optical Recording," SPIE, vol. 935 p. 63, Apr. 8, 1988.

*Primary Examiner*—Aristotelis Psitos
*Assistant Examiner*—Nabil Hindi
*Attorney, Agent, or Firm*—Henry E. Otto, Jr.

[57] ABSTRACT

An optical data storage system including an amplifier which (i) provides a differential current input having a low impedance over the full range of frequencies for which amplification is required in an optical detector that includes a photodiode that senses the intensity of an optical signal generated by data on the optical storage medium; (ii) reverse biases the photodiode; (iii) amplifies the signal current from both sides of the photodiode to improve signal-to-noise ratio; and (iv) is isolated from and unaffected by power supply noise.

8 Claims, 3 Drawing Sheets

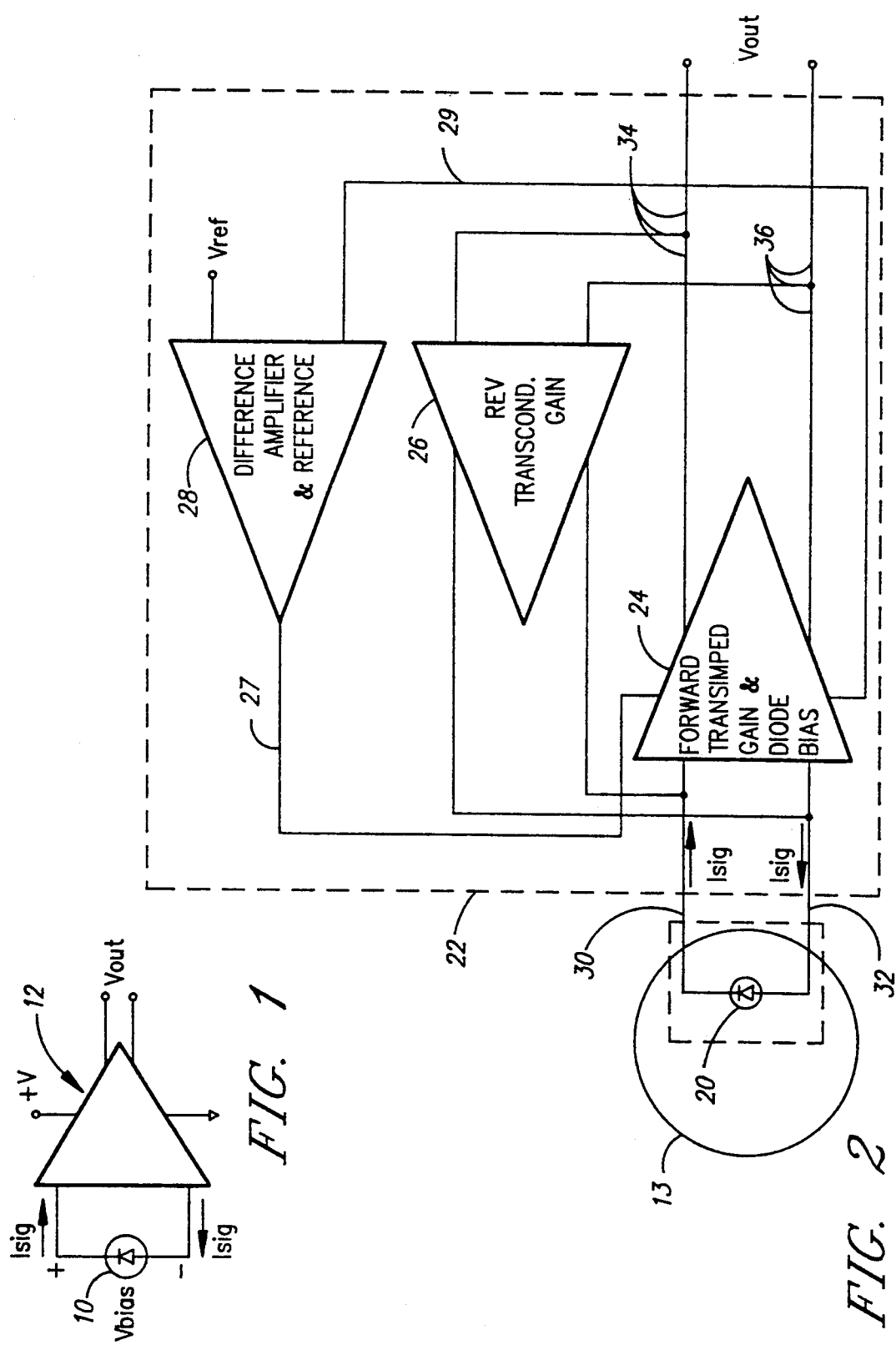

DIFFERENTIAL AMPLIFIER FOR OPTICAL DETECTORS IN AN OPTICAL DATA STORAGE SYSTEM

FIELD OF THE INVENTION

This invention relates to circuitry for use in optically detecting digital data stored on an optical storage medium, and relates more particularly to a low input impedance differential current amplifier which, when used in an optical detector for an optical storage system, provides increased signal-to-noise ratio and increased bandwidth and is not adversely affected by power supply noise.

BACKGROUND OF THE INVENTION

Optical detectors are critical components in optical and magneto-optical data storage systems. Historically, amplifiers for photosensitive diodes used in optical detectors have been of the transimpedance type and have had a single-ended rather than a differential input. A transimpedance amplifier has been used because the signal generated by the photosensitive diode has been in the form of a current when the diode is reverse-biased with a substantial voltage (typically several volts or greater), and the desired output has been in the form of a voltage. It has also been convenient to tie the cathode of the diode to the positive supply voltage so that a typical operational amplifier could be used with resistor feedback to effect a transimpedance gain. This configuration results in half of the available signal current from the diode being effectively dumped into the positive supply, causing a signal reduction at the input to the preamplifier. Moreover, this kind of configuration has no common-mode rejection for injected common-mode currents (caused by, e.g., parasitic capacitances to the environment). Any common mode current passes through as though it were a signal current; and the common mode rejection ratio (CMRR) is 0 dB.

The only prior art of interest of which applicants are aware in Japanese application 63-249382 published Oct. 17, 1988. That application does not provide details of the amplifier construction. However, it shows a photodiode biased indirectly by impedances (resistors) between a power supply and the photodiode, which is alleged to eliminate the common-mode signal. The photodiode is decoupled from the power supply using capacitors. This would imply a high input impedance. Capacitive coupling between the photodiode and amplifier would imply a voltage amplifier, although it is not clear whether the amplifier is a differential voltage or differential current type. The circuit cannot offset power supply noise because the photodiode is biased through resistors of limited size. Any attempt to increase gain by increasing the values of the patentee's resistors (3 and 4) would increase the signal voltage level (at B and C), but degrade the frequency response and hence bandwidth and provide parasitic capacitance between B, C and ground.

There is a need for an optical data storage system comprising an amplifier which:

(i) provides a differential current input having a low impedance over the full range of frequencies for which amplification is required in an optical detector that includes a photodiode that senses the intensity of an optical signal generated by data on an optical storage medium;

(ii) reverse biases the photodiode;
(iii) amplifies the signal current from both sides of the photodiode to improve signal-to-noise ratio; and
(iv) is isolated from and unaffected by power supply noise.

SUMMARY OF THE INVENTION

Toward this end and according to the invention, an optical data storage system and detection method is provided having circuitry comprising a photodiode for providing differential output signal current corresponding to the intensity of an optical input signal generated by data sensed from an optical storage medium. A transimpedance amplifier connected to a supply voltage source has a differential voltage output for providing an output voltage signal corresponding to the data.

The amplifier includes a broadband feedback circuit comprising a forward transconductance gain and diode biasing stage for receiving, as an input, the differential output signal current from the photodiode for increasing the signal-to-noise ratio (SNR) of the output voltage signal. It also includes a reverse transconductance gain stage for providing feedback currents to the input of the forward stage to insure low input impedance to the amplifier and minimize differential offset of the differential voltage output. It is characteristic of a transimpedance amplifier that the voltage at the input is determined by the amplifier. In this invention, the voltage imposed on the two differential inputs is thus determined to provide a reverse bias on the photodiode. This differential voltage across the photodiode is generated in such a manner as to be insensitive to variations in power supply. A low frequency feedback circuit comprising the forward stage and a difference amplifier and reference stage controls shot noise generated by the amplifier by controlling the quiescent operating point of the amplifier. A cascode substage may be included in the first stage to improve the bandwidth of the amplifier.

BRIEF DESCRIPTION OF THE DRAWINGS

FIG. 1 depicts, in simplified form, a schematic diagram of an optical detector circuit embodying the invention;

FIG. 2 is a circuit diagram of a preferred embodiment of the invention depicting an optical detector with broadband current feedback;

DESCRIPTION OF PREFERRED EMBODIMENTS

Figure 4:
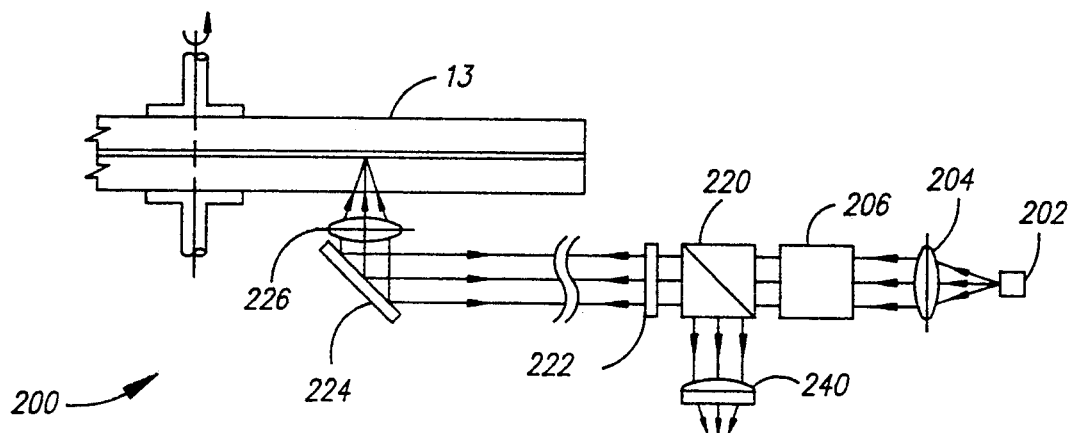
FIGS. 4 and 5 are schematic diagrams of a reflectivity sensing optical disk system and magneto-optic disk drive system, respectively, both previously proposed, to generate optical signals from the disk.

As illustrated in FIG. 1, the circuit embodying the invention comprises a photodiode 10 and an amplifier 12. Photodiode 10 is reverse biased by amplifier 12 with a voltage Vbias independent of a supply voltage source V+. Photodiode 10 senses the intensity of an optical input signal generated by data on an optical storage medium 13, such as a disk (shown to greatly reduce scale in FIG. 2), and provides a differential output signal current Isig that serves as a differential input signal current to amplifier 12. Amplifier 12 is connected to supply voltage source V+ and, as illustrated, has differential outputs Vout that provide an output voltage corresponding to the data sensed by the photodiode 10.

In single ended prior art circuits, only one of the two signal currents Isig was amplified; the other was effectively dumped into the positive voltage source V+. Assuming the noise of such a prior art amplifier to be N, the SNR would be Isig/N. By contrast, use of the differential output signal current Isig from photodiode 10 is applicants' differential amplifier desirably improves signal-to-noise ratio (SNR) especially if noise generated by the amplifier 10 is dominant. Since both signal currents Isig are correlated, the differential output signal is 2Isig, which provides a SNR of $2Isig/N\sqrt{2}$, assuming total noise N for differential amplifier 10 to be $\sqrt{2}$ times that of single ended prior art amplifiers. Thus, dividing the SNR of applicants' circuit by that of the prior art yields, for applicants' differential amplifier circuit, a theoretical advantage in SNR of $\sqrt{2}$ or 3 dB.

Thus, according to the invention, applicants concurrently reverse bias photodiode 10 and amplify the differential output signal current from the photodiode with amplifier 12.

As illustrated in FIG. 2, the preferred embodiment of optical detector circuit comprises a photodiode 20 and an amplifier 22. Amplifier 22 comprises a forward transimpedance gain and diode bias step 24, a reverse transconductance gain stage 26, and a difference amplifier and reference stage 28.

Differential current outputs 30, 32 from photodiode 20 serve as differential inputs to forward gain/bias stage 24 which provides a differential output voltage Vout between lines 34, 36 corresponding to the data detected by the photodiode 20. Reverse gain stage 26 has its inputs connected to lines 34, 36. The outputs of stage 26 provide feedback currents via lines 30, 32 to the inputs of forward stage 24. An output from stage 24 to line 29 provides a signal representing the quiescent or dc-steady state operating point of stage 24. Line 29 is connected to one of the inputs of difference amplifier/reference stage 28. The signal on line 29 is compared to the voltage Vref that is present on the other input to stage 28. This comparison generates a control signal on line 27 that drives an input on stage 24 that regulates the quiescent operating point of stage 24 relative to the predetermined value set by Vref.

The forward gain/bias stage 24 and reverse gain stage 26 constitute a broadband feedback circuit which utilizes the feedback currents in lines 30 32 to insure low input impedance to the amplifier 22. The forward gain/bias stage 24 and difference amplifier/reference stage 28 constitute a low frequency feedback circuit to automatically adjust the quiescent operating point of stage 24 as a means of controlling the shot noise generated by the amplifier. When the loop consisting of stages 24, 26 is closed, a voltage will be imposed on inputs 30, 32 to stage 24. The voltages on lines 30, 32 are selected to provide a desired reverse bias voltage on photodiode 20 that is isolated from, and hence not degraded by, changes in the power supply voltage source V+. The differential inputs 30, 32 to stage 24 increase the magnitude, relative to the single-ended prior art configuration, of the input signal current to amplifier 22 for desirably increasing the SNR in the output voltage signal Vout across lines 34, 36.

Figure 3:
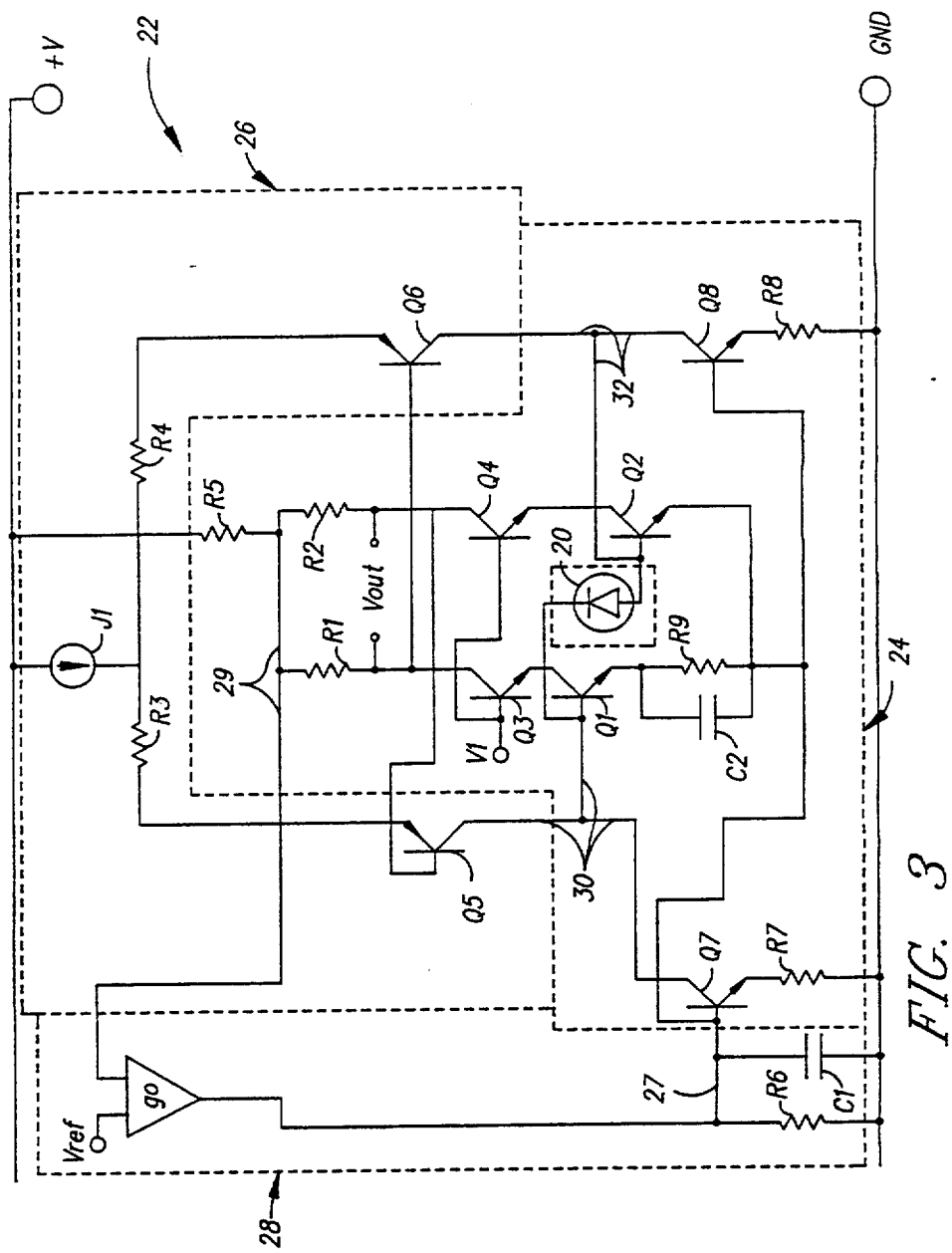
FIG. 3 is a detailed circuit implementation of the optical detector of FIG. 2.

FIG. 3 depicts detailed circuitry for implementing the optical detector schematically shown in FIG. 2. To the extent appropriate, the same reference numerals will be used in FIG. 3 to identify elements or interconnections which are identical with those of FIG. 2.

As illustrated in FIG. 3, the forward transimpedance gain and diode bias stage 24 of amplifier 22 comprises NPN transistors Q1, Q2, Q3, Q4, Q7, Q8, resistors R1, R2, R5, R7, R8, R9 and capacitor C2. Transistors Q1 and Q2 provide current amplification. Transistors Q3 and Q4 act as a cascode substage to improve the bandwidth of the amplifier; however, if preferred, this cascode substage may be eliminated, as it is not essential to the invention. The collectors of transistors Q3 and Q4 are connected to supply voltage source V+ via resistors R1, R2, respectively, and a common resistor R5. Voltage source V1 is connected to the bases of Q3 and Q4. Voltage V1 is a low impedance voltage source chosen so as to bias the cascode substage such that saturation does not occur. Output voltage signal Vout is detected across the collectors of Q3, Q4. The emitters of Q3, Q4 are connected, respectively, to the collectors of NPN transistors Q1, Q2, respectively. The emitter of Q1 is connected via a parallel network formed by capacitor C2 and resistor R9 to the emitter of Q2. The bases of Q1, Q2 are connected via lines 30, 32, respectively, to photodiode 20 and respectively to the collectors of Q7, Q8. Line 27 connects to the bases of Q7, Q8, the emitter of Q2 and RC circuit C2, R9. The emitters of Q7, Q8 are connected via resistors R7, R8, respectively, to ground GND. Line 29 connects to the common point of resistors R1, R2 and R5 and to one of the inputs to gain stage go.

The reverse transconductance gain stage 26 of amplifier 22 comprises PNP transistors Q5, Q6 whose emitters are connected to supply voltage source V+ via resistors R3, R4, respectively, and a current source J1. The collectors of transistors Q5 and Q7 and collectors of Q6 and Q8 are connected, respectively, to the bases of transistors Q1, Q2 of the forward stage via lines 30, 32, respectively.

The difference amplifier and reference stage 28 comprises transconductance gain stage go, resistor R6 and capacitor C1. One input of go is connected to the common node of R1, R2, R5. The other input is connected to Vref which is a voltage source referenced to supply voltage V+. Gain stage go connects via line 27 to the base of Q7 the emitter of Q2, the resistor R9, capacitor C2 and the base of Q8 to regulate the quiescent operating point of stage 24. Resistor R6 and capacitor C1 form a low pass network which converts the current output of go into a control voltage.

The circuit illustrated in FIG. 3 has substantial current gain resulting in a high transimpedance gain, uses broadband current feedback to effect a low input impedance using the PNP feedback amplifier including transistors Q5, Q6, and also provides low frequency feedback in order to maintain prior bias for the input devices Q1, Q2. The cascode substage of the forward stage 24 consists of devices Q3 and Q4, voltage V1 and collector resistors R1 and R2 and improves high frequency response. If the cascode stage is not needed for extended high frequency response, Q3, Q4 and V1 can be removed and the collectors of Q1 and Q2 should be connected to R1 and R2, respectively. The photodiode 20 is connected between the bases of input devices Q1 and Q2. The voltages which exist between the emitters of Q1 and Q2 become the reverse bias voltage for the photodiode. A first emitter voltage of Q2 is merely the voltage present at capacitor C1, and a second emitter voltage of Q1 the voltage at the said first emitter plus the voltage is generated across resistor R9 by the mutual effect of the broadband and low frequency feedback circuits. Capacitor C2 eliminates the noise across resistor R9.

Devices Q5 and Q6, resistors R3 and R4 and current source J1 of the reverse gain stage 26 apply the output signal at Vout back to the bases of the input devices Q1, Q2 where photodiode 20 is connected. This negative feedback lowers the input impedance of the amplifier by feeding back a current out of phase with the signal current Isig generated by photodiode 20.

The low frequency feedback circuit biases the input devices Q1, Q2 at a prescribed current level. This bias current must be kept low enough that the shot noise of input devices Q1, Q2 does not dominate the amplifier noise, and high enough so that adequate high frequency bandwidth exists. The current level of the input bias is monitored by the voltage across resistor R5 with respect to the positive supply voltage V+.

Transconductance substage go of stage 28 generates a current which is proportional to the difference between Vref and that voltage across resistor R5. This current is used to create a voltage across resistor R6. Capacitor C1 across resistor R6 creates a dominant pole in the transfer characteristic of this low frequency feedback path. The voltage across R6 and C1 is then transformed back to a current by devices Q7 and Q8 and resistors R7 and R8. The difference between this resultant current as regulated by the output of the low frequency feedback circuit and the current provided by the PNP devices Q5, Q6 is the biasing current for the bases of input devices Q1, Q2. Hence there is a need to control this difference in current to allow for $\beta$ and temperature effects on the bias current of the input devices. Capacitor C1 also eliminates much of the noise in the output current of the low frequency feedback circuit which contributes to overall amplifier noise.

The broadband feedback circuit also insures that the DC biasing currents through each input device Q1, Q2 are substantially equal; and the low frequency feedback circuit insures that the sum of each of these bias currents is kept at a prescribed level. Hence, the current through R9 is controlled to a value equal to Vref divided by twice the resistance of R5. The value of R9 is chosen to determine the reverse bias voltage imposed across photodiode 20.

If preferred, broadband current feedback to effect low input impedance and transimpedance gain can be achieved by use of an NPN feedback amplifier and a level shifting stage instead of the PNP stage illustrated in FIG. 3.

Feasibility of an amplifier circuit of the type as defined in the claims was established by computer simulation.

Input to Photodiode 20

For completeness, the optical input signal to the photodiode 20 of FIGS. 2 and 3 may be generated from disk 13 in the manner described in the commonly owned copending application, Ser. No. 07/582,286, filed Sep. 12, 1990, entitled, Passive Absorptive Resonator Laser System and Method.

If the disk 13 is an optical disk, the system 200 illustrated in FIG. 4 may be used. This system comprises a laser diode 202, the light from which is collimated by lens 204 and passes to a circularizing optical element 206. Element 206 emits light having a circular cross-sectional beam pattern. Element 206 may be a prism.

The light then passes through a polarizing beam splitter 220 and a quarter-wave plate 222. The light is reflected from mirror 224 and focussed by a lens 226 onto optical data storage medium 13. Medium 13 may be a reflectivity type of optical recording medium, such as phase change, write once read many (WORM) or read only memory (ROM).

The light reflected from medium 13 returns through lens 226, is reflected from mirror 224, passes through plate 222 to beam splitter 220. The reflected light is then diverted by beam splitter 220 to astigmatic lens 240. Lens 240 focuses the reflected light onto an optical detector 242 including at least one photodiode 20. The recorded spots on the medium 13 have different reflectivities and these differences are detected by optical detector 242 as data ones and zeros. Detector 242, which is a multisegmented detector as is known in the art, also provides tracking and focus signals. An amplifier 22 of the present invention is preferably connected to each photodiode 20 forming part of detector 242.

Figure 5:
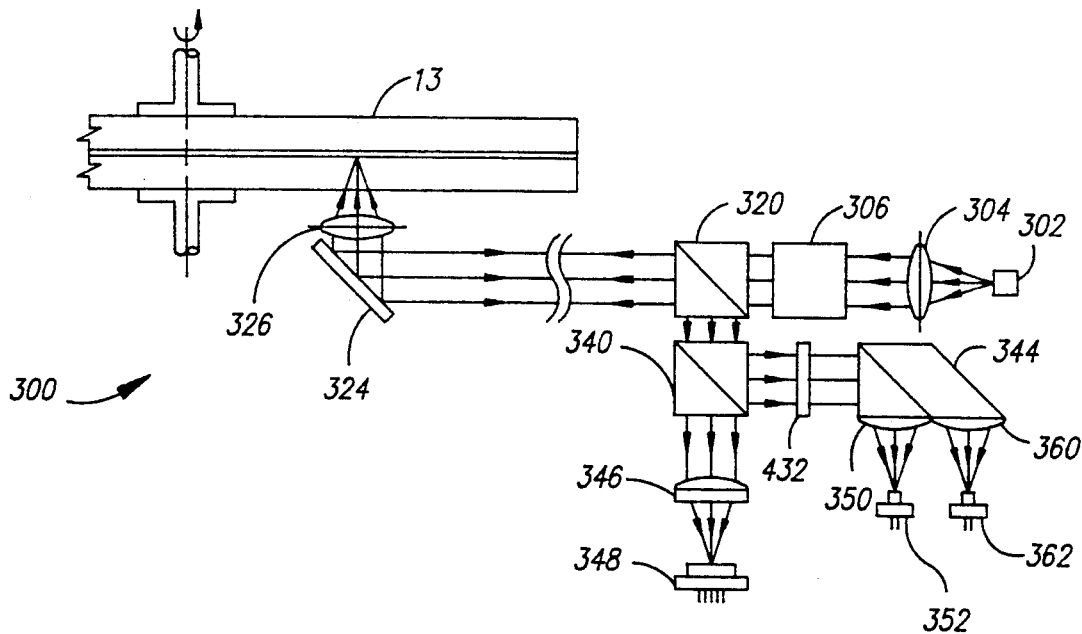
Figure 4:
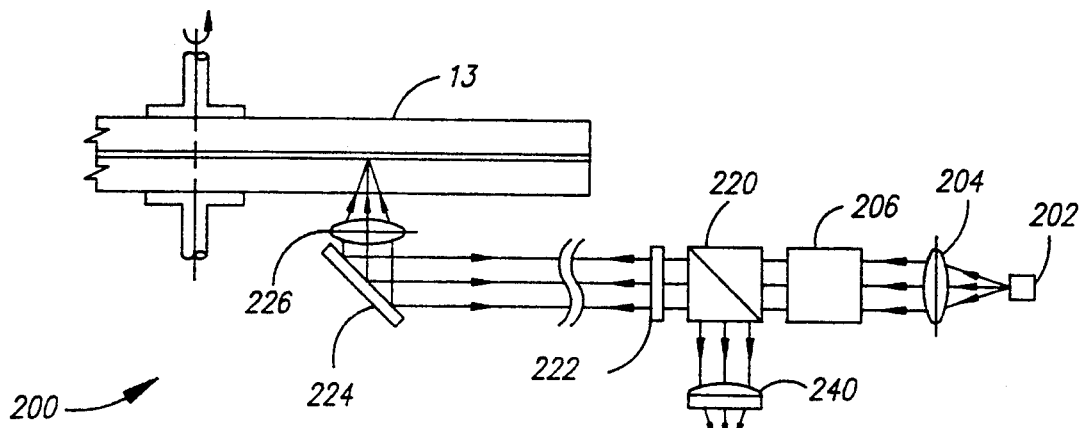
Figure 5:
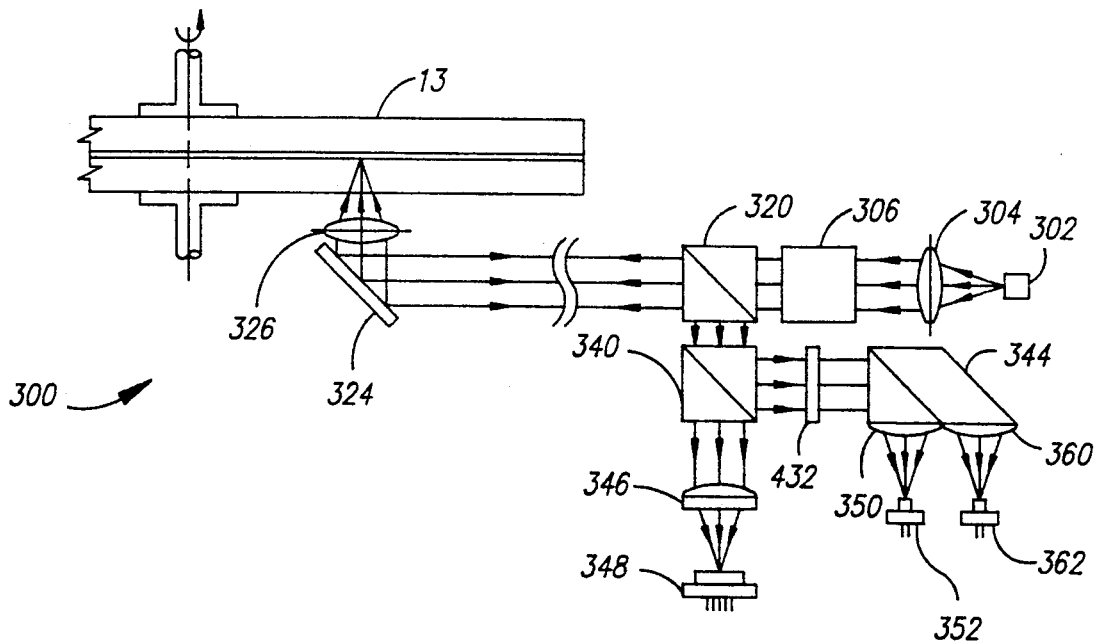

If disk 13 is a magneto-optical disk, the system 300 illustrated in FIG. 5 may be used. This system comprises a laser diode 302, the light from which is collimated by a lens 304 and passes to a circularizing optical element 306. Element 306 emits light having a circular cross-sectional beam pattern. Element 306 may be a prism.

The light then passes through a leaky polarizing beam splitter 320. Beam splitter 320 has reflectivities of $R_p > 0$ and $R_s$ approximately equal to one (p and s represent the orthogonal polarization components of the light). The light is then reflected from a mirror 324 to a lens 326 and is focussed onto the optical recording medium 13.

The light reflected from medium 13 returns through lens 326, reflects from mirror 324 and enters beam splitter 320. Beam splitter 320 diverts the reflected light to an amplitude beam splitter 340. Reflected data light is diverted to half wave plate 342 and to a beam splitter 344. Reflected light of other amplitudes passes straight through beam splitter 340. This light is focussed by an astigmatic lens 346 to a quad detector 348 to produce tracking and focus signals.

Medium 13 has recorded spots having either an up or down magnetic domain. The plane of polarization of light reflected from these spots is rotated one way or the other depending upon the direction of the magnetic domain. Beam splitter 344 separates the reflected light depending upon which way the plane of polarizing has been rotated. Separated beams go to a lens 350 and an optical detector 352 or to a lens 360 and an optical detector 362. Each detector 352 and 362 comprises at least one photodiode 20. The difference in output signals of detectors 352 and 362 are the data ones and zeros. A more detailed explanation of optical disk drive systems is given in "Gradient-Index Optics and Miniature Optics" SPIE, Vol. 935, p. 63 (1988) by Glenn T. Sincerbox. An amplifier 22 of the present invention is preferably connected to each of the photodiodes 20 forming part of detectors 348, 352 and 362.

While the invention has been described with reference to a preferred embodiment thereof, it will be understood by those skilled in the art that the foregoing and other modifications can be made within the teachings and scope of the invention. Hence, the invention is not to be deemed limited in scope except as required by the claims.

We claim:

1. In an optical data storage system, circuitry for sensing digital data from a data storage medium, comprising:
   - a photodiode for sensing the intensity of an optical input signal generated by data on the medium and providing a differential output signal current;
   - a supply voltage source; and
   - an amplifier connected to said source and having a differential voltage output for providing an output voltage signal corresponding to the data, said amplifier including:
     - (i) a broadband feedback circuit comprising a forward transimpedance gain and diode bias stage that receives the differential output signal current, to increase signal-to-noise ratio of the output voltage signal, and a reverse transconductance gain stage that provides feedback currents to the forward stage to insure low input impedance to the amplifier and minimize differential offset of said differential voltage output;
     - (ii) a low frequency feedback circuit comprising said forward stage and a difference amplifier/reference stage for controlling shot noise generated by the amplifier, and
     - (iii) means including said feedback circuits for reverse biasing the photodiode with a voltage and isolating the photodiode from noise from said voltage source.

2. The system of claim 1, wherein the amplifier has a quiescent operating point, and the low frequency feedback controls the shot noise by controlling said quiescent operating point.

3. The system of claim 1, wherein the amplifier comprises a cascode substage forming part of the forward stage for improving bandwidth of the amplifier.

4. An optical data storage system comprising:
   - a data storage medium for storing digital data; and
   - circuitry for optically sensing digital data stored on the medium, said circuitry comprising:
   - a reverse-biased photodiode for sensing the intensity of an optical input signal generated by data on the medium and providing a differential output signal current;
   - a supply voltage source; and
   - an amplifier connected to said source and having a differential voltage output for providing an output voltage signal corresponding to the data, said amplifier including:
     - (i) a broadband feedback circuit comprising a first stage having the differential output signal current from the photodiode as a differential input current for increasing the signal-to-noise ratio of the output voltage signal, and a second stage providing feedback currents to the input of said first stage to insure low input impedance to the amplifier and minimize differential offset of said differential voltage output, and
     - (ii) a low frequency feedback circuit that includes one of said stages of said broadband feedback circuit for controlling shot noise generated by the amplifier.

5. The system of claim 4, including means including said feedback circuits for reverse biasing the photodiode with a preselected voltage and concurrently isolating the photodiode from noise from said voltage source.

6. An optical data storage system comprising:
   - an optical data storage medium;
   - a radiation transmission means for directing a radiation beam to the data storage medium;
   - a radiation reception means for receiving a reflected radiation beam from the medium, said reception means including a radiation sensitive detector including a reverse-biased photodiode for sensing the intensity of an optical input signal generated by data on the medium and providing a differential output signal current;
   - a supply voltage source; and
   - an amplifier connected to said source and having a differential voltage output for providing an output voltage signal corresponding to the data, said amplifier including:
     - (i) a broadband feedback circuit comprising a first stage connected to the photodiode and having the differential output signal current from the photodiode as a differential input current for increasing the signal-to-noise ratio of the output voltage signal, and a second stage providing feedback currents to the input of said first stage to insure low input impedance to the amplifier and minimize differential offset of said differential voltage output, and
     - (ii) a low frequency feedback circuit that includes one of said stages of said broadband feedback circuit for controlling shot noise generated by the amplifier.

7. The system of claim 6, including means including said feedback circuits for reverse biasing the photodiode with a preselected voltage and concurrently isolating the photodiode from noise from said voltage source.

8. A method for sensing digital data from a data storage medium in an optical data storage system, comprising the steps of:
   - with a photodiode, sensing the intensity of an optical input signal generated by data on the medium for providing a output signal current;
   - inputting the output signal current to an amplifier for generating a differential voltage output corresponding to the data and generative feedback currents to (i) insure low input impedance to the amplifier, (ii) minimize the differential offset of the differential voltage output, (iii) concurrently reverse bias the photodiode with a voltage, and (iv) isolate the photodiode from noise from a supply voltage source connected to the amplifier; and
   - providing a low frequency feedback current including a reference voltage source and resistor means for regulating operating current to the amplifier for thereby controlling shot noise generated by the amplifier.

* * * * *

UNITED STATES PATENT AND TRADEMARK OFFICE
CERTIFICATE OF CORRECTION

PATENT NO. : 5,287,340
DATED : Feb. 15, 1994
INVENTOR(S) : Dale B. Chapman, et al It is certified that error appears in the above-indentified patent and that said Letters Patent is hereby corrected as shown below:

The drawing sheet 2 of 3 should be deleted to be replaced with the drawing sheet, consisting of Fig. 3, as shown on the attached page.

Signed and Sealed this

Sixth Day of September, 1994

Attest:

BRUCE LEHMAN

Attesting Officer

Commissioner of Patents and Trademarks